US006483340B2

(12) United States Patent
Uenishi

(10) Patent No.: US 6,483,340 B2
(45) Date of Patent: Nov. 19, 2002

(54) HIGH INTEGRATION-CAPABLE OUTPUT BUFFER CIRCUIT UNAFFECTED BY MANUFACTURING PROCESS FLUCTUATIONS OR CHANGES IN USE

(75) Inventor: Yasutaka Uenishi, Kawasaki (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/884,757

(22) Filed: Jun. 19, 2001

(65) Prior Publication Data

US 2002/0011881 A1 Jan. 31, 2002

(30) Foreign Application Priority Data

Jun. 20, 2000 (JP) ........................................ 2000-185320

(51) Int. Cl.[7] ..................... H03K 17/16; H03K 19/0175
(52) U.S. Cl. ........................... 326/27; 326/85; 326/113; 327/170
(58) Field of Search ............................... 326/27, 85, 91, 326/83, 34, 113; 327/112, 170, 380, 381

(56) References Cited

U.S. PATENT DOCUMENTS 4,855,623 A * 8/1989 Flaherty ...................... 307/475
5,124,579 A * 6/1992 Naghshineh ................ 307/443
5,854,560 A * 12/1998 Chow ........................... 326/27

FOREIGN PATENT DOCUMENTS

JP            11-191729        7/1999   ....... H03K/19/0175

* cited by examiner

Primary Examiner—Daniel D. Chang
(74) Attorney, Agent, or Firm—Hayes Soloway P.C.

(57) ABSTRACT

An output buffer circuit 1 comprises an output transistor section 10, a first and a second driving means 40, 50, and a first and a second switch circuits 60, 70. The output transistor section 10 comprises PMOS 11, 13, and NMOS 12, 14. Each source terminal of the PMOS 11, 13 is connected to VDD, each source terminal of the NMOS 12, 14 is connected to GND, and each drain terminal of the PMOS 11, 13 and NMOS 12, 14 are all connected to an output terminal N1 of the output buffer circuit 1. The driving capability of the PMOS 13 is set to be larger than that of PMOS 11, and the driving capability of the NMOS 14 is set to be larger than that of NMOS 12.

6 Claims, 9 Drawing Sheets

HIGH INTEGRATION-CAPABLE OUTPUT BUFFER CIRCUIT UNAFFECTED BY MANUFACTURING PROCESS FLUCTUATIONS OR CHANGES IN USE

BACKGROUND OF THE INVENTION

1. Field of the Invention

The present invention relates to an output buffer circuit to be loaded in a semiconductor integrated circuit device, and particularly to an output buffer circuit in which the output transistors are divided.

2. Description of the Related Art

Conventionally, such types of output buffer circuits in which the output transistors are divided have been proposed variously. FIG. 1 is a circuit diagram showing an example of a conventional output buffer circuit. As shown in FIG. 1, a conventional output buffer circuit 500 comprises an output transistor section 510 and an inverter 540,550. The output transistor section 510 comprises an inverter 520 and an inverter 530 connected in parallel. The inverter 520 comprises a PMOS transistor (hereinafter referred to as a PMOS) 521 and a NMOS transistor (hereinafter referred to as a NMOS) 522 having channel widths which satisfy a desired driving capability. Also, the inverter 530 comprises a PMOS 531 and a NMOS 532. The channel widths of the PMOS 531 and the NMOS 532 are narrower than those of the PMOS 521 and the NMOS 522. Furthermore, an input terminal of the inverter 520 is connected to an output terminal N504 of the inverter 540, and an input terminal of the inverter 530 is connected to an output terminal N505 of the inverter 550.

Both of the output terminals of the inverters 520, 530 are connected to an output terminal N503 of the output buffer circuit 500. Also, both of the input terminals of the inverters 540, 550 which drive the inverters 520, 530, respectively, are connected to an input terminal N2 of the output buffer circuit 500. Furthermore, the inverters 540, 550 consist of transistors having generally the same sizes.

Also, an example of another conventional output buffer circuit is disclosed in Japanese Patent Publication Laid-Open No. Hei 11-191729 (hereinafter referred to as the prior art). FIG. 2 is a circuit diagram showing an output buffer circuit disclosed in the prior art. As shown in FIG. 2, transistors PMOS 624a, 626a and NMOS 624b, 626b of output final stages divided into at least two are provided in an output buffer circuit 610 disclosed in the prior art. Also, a transistor PMOS 618a for current-voltage limiting is provided between a gate of the PMOS 624a and a gate of the PMOS 626a, and a transistor NMOS 618b for current-voltage limiting is provided between a gate of the NMOS 624b and a gate of the NMOS 626b. Also, driving circuits 616a, 616b for driving the PMOS 624a and the NMOS 624b respectively, in response to potential of an internal signal line 632 are connected to each gate of the PMOS 624a and the NMOS 624b. In addition, gates of the transistors PMOS 626a, NMOS 626b are connected with potential compensation circuits 622a, 622b for compensating the potential of the gate thereof.

In the output buffer circuit 610, when each transistor of the output final stage becomes ON, the driving circuits 616a, 616b drive a gate end of one transistor of the output final stage and at the same time, drive a gate end of another transistor of the output final stage via the transistor for current-voltage limiting, thereby controlling the slew rate of current to suppress the generation of noise and perform high speed operation.

In the conventional output buffer circuit structure in general, for example, if the slew rate standard becomes strict, as in an output buffer circuit for PCI (Peripheral Component Interconnect), then fluctuation in the manufacturing process can have a great effect, and it is very difficult to satisfy the slew rate standard according to conditions such as temperature, power supply voltage, etc.

For example, in the above described output buffer circuit 500 shown in FIG. 1, when adjustment of the slew rate of the signal of the output terminal N503 is desired, it is necessary to blunt the output waveforms of the inverters 540, 550. However, if the output waveforms of the inverters 540, 550 become blunt, then the influence on the output waveforms of the inverters 540, 550 becomes great when a channel length L and threshold voltage (hereinafter, referred to as $V_{TH}$) of the transistor have changed, and at the same time, the influence is added to variations of the PMOS 521, 531 and the NMOS 522, 532 of the output transistor sections and appears at a signal OUT of the output terminal N503.

Also, in the output buffer circuit 610 of FIG. 2 disclosed in the prior art, the stability of rise time, fall time and signal delay time, etc. of the output signal of an output pad 634 depends on the channel length L and $V_{TH}$ of the final stage transistors PMOS 624a, 626a and NMOS 624b, 626b, and depends as well on the driving capability of the driving circuits 616a, 616b for supplying a signal to the gate end of each of the above-described transistors and the channel length L and $V_{TH}$ of transistors PMOS 620a, 628b and NMOS 620b, 628a. Accordingly, fluctuation in the manufacturing process is reflected in the channel length L and $V_{TH}$ of the final stage transistors PMOS 624a, 626a and NMOS 624b, 626b, as well as in the driving capability of the driving circuits 616a, 616b and the channel length L and $V_{TH}$ of the transistors PMOS 620a, 628b and NMOS 620b, 628a, such that the stability of output operation of the output pad 634 can not be ensured.

FIG. 3 is a schematic waveform diagram showing the change in the output signal upon rising in the conventional output buffer circuit. In FIG. 3, a line $W_{fast}$ represents the slew rate under a condition that the rising is fast in the conventional output buffer circuit, a line $W_{slow}$ represents the slew rate under a condition that the rising is slow, a line $W_{max}$ represents the maximum slew rate permissible in the PCI, and a line $W_{min}$ represents the minimum slew rate permissible in the PCI. As shown in FIG. 3, the slew rate represented by the line $W_{fast}$ is greater than the slew rate represented by the line $W_{max}$. As such, in the case of the output buffer circuits shown in FIGS. 1 and 11, there is a problem that the rise time Tr and the fall time Tf of the output signal deviate from the value specified by the PCI standard, according to conditions such as temperature, power supply voltage, etc.

Also, the conventional output buffer circuit 610 shown in FIG. 2, is problematic, in that PMOS 618a, 620a, 628b, NMOS 618b, 620b, 628a, inverters 630a, 630b are needed in addition to the general driving circuits 616a, 616b, such that layout size becomes large and the circuit structure becomes complicated.

SUMMARY OF THE INVENTION

An object of the present invention is to provide an output buffer circuit having a divided output transistor, wherein the influence of characteristic variations due to manufacturing process fluctuation and the influence of conditions from change in use such as temperature, power supply voltage are suppressed, and at the same time, a circuit structure is simplified and miniaturized, so that high integration is possible.

An output buffer according to the present invention comprises an output transistor section, and the output transistor section includes an output terminal, a first and a second transistors of the first conductive type of which each one end of source-drain line is connected to a high potential power supply and other end thereof is connected to said output terminal, and a first and a second transistor of the second conductive type of which each one end of source-drain line is connected to a low potential power supply and other end thereof is connected to said output terminal. Also, said output buffer circuit comprises a first transfer gate including a first input terminal to which input signal is inputted and a first driving output terminal to be connected to a gate of said first transistor of the first conductive type and a gate of said second transistor of the second conductive type, and a second transfer gate including a second input terminal to which said input signal is inputted and a second driving output terminal to be connected to a gate of said second transistor of the first conductive type and a gate of said first transistor of the second conductive type. Furthermore, said output buffer circuit comprises a first switch circuit connected between the gate of said second transistor of the first conductive type and said second driving output terminal and including a transfer gate so that conduction thereof is controlled by control signal, and a second switch circuit connected between the gate of said second transistor of the second conductive type and said first driving output terminal and including a transfer gate so that conduction thereof is controlled by control signal. At this time, a driving capability of said second transistor of the first conductive type is larger than that of said first transistor of the first conductive type, and a driving capability of said second transistor of the second conductive type is larger than that of said first transistor of the second conductive type.

In the present invention, an output terminal of the first transfer gate is connected to the gate of the second transistor of the second conductive type via the second switch circuit, and an output terminal of the second transfer gate is connected to the gate of the second transistor of the first conductive type via the first switch circuit. Thereby, when the characteristics of the transistor and use environment are changed, respective operations for making the rise of the output signal of the first and the second transfer gate to be steep and to be smooth are caused at the same time and change of the output signal upon rising of the first and the second transfer gate can be reduced.

Therefore, the output buffer circuit according to the present invention can obtain an effect of suppressing the influence on a signal delay time of the output buffer circuit, rise time, fall time, slew rate, to be small by the connection method of the divided output transistor, even though characteristics such as a channel length of the transistor and threshold voltage are varied due to fluctuations in the process of manufacturing a semiconductor integrated circuit device loaded with the output buffer circuit.

Also, it is possible to adjust the slew rate by a combination of connection of the output transistor section and a minimal addition of elements, and to simplify the structure of the output buffer circuit so that layout area can be reduced, and thereby high integration can be achieved.

Also, it is preferred that conduction of said first and said second switch circuits are controlled synchronously by the same control signal. Furthermore, said first and said second switch circuits may be transfer gates.

Another output buffer circuit according to the present invention comprises an output transistor section, and the output transistor section comprises an output terminal, a first and a second transistors of the first conductive type of which each one end of source-drain line is connected to a high potential power supply and other end thereof is connected to said output terminal, and a first and a second transistor of the second conductive type of which each one end of source-drain line is connected to a low potential power supply and other end thereof is connected to said output terminal. Also, said output buffer circuit comprises a first transfer gate including a first input terminal to which input signal is inputted and a first driving output terminal to be connected to a gate of said first transistor of the first conductive type and a gate of said second transistor of the second conductive type, and a second transfer gate including a second input terminal to which said input signal is inputted and a second driving output terminal to be connected to a gate of said second transistor of the first conductive type and a gate of said first transistor of the second conductive type. At this time, said second transistor of the first conductive type has a larger driving capability than that of said first transistor of the first conductive type, and said second transistor of the second conductive type has a larger driving capability than that of said first transistor of the second conductive type.

BRIEF DESCRIPTION OF THE DRAWINGS

The above objects, other objects, features and advantages of the present invention will be better understood from the following description taken in conjunction with the accompanying drawings, in which.

DETAILED DESCRIPTION OF THE PREFERRED EMBODIMENTS

Figure 4:
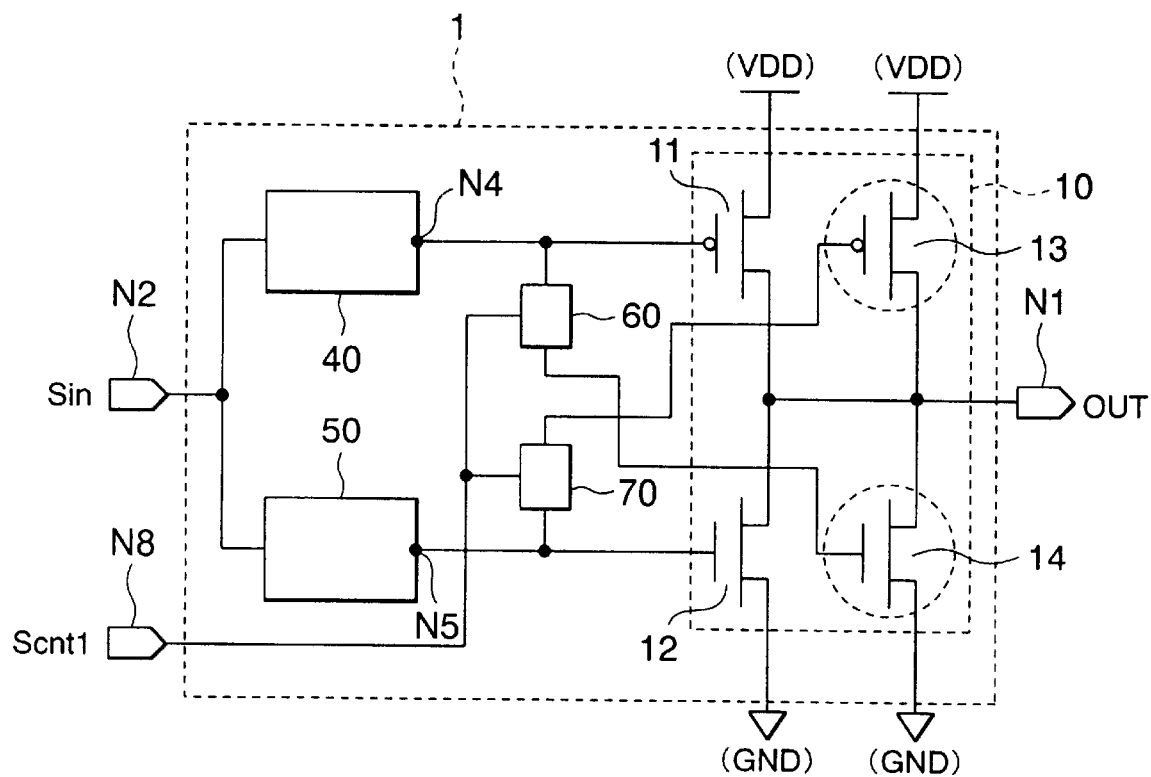
FIG. 4 is a block diagram showing an output buffer circuit according to a first embodiment of the present invention.

Now, embodiments of the present invention will be explained in detail with reference to accompanying drawings. First, a first embodiment of the present invention will be explained. FIG. 4 is a block diagram showing an output buffer circuit according to the first embodiment of the present invention. Also, FIG. 5 is a circuit diagram showing a detailed structure of the output buffer circuit shown in FIG. 4.

As shown in FIG. 4, an output buffer circuit 1 according to the first embodiment comprises an output transistor section 10, a first and a second driving means 40, 50, and a first and a second switch circuit 60, 70. The output transistor section 10 comprises P channel MOS transistors (hereinafter referred as PMOS) 11, 13 which are a first and a second transistor of the first conductive type, and N channel MOS transistors (hereinafter referred as NMOS) 12, 14 which are a first and a second transistor of the second conductive type. Each source terminal of the PMOS 11, 13 is connected to a high potential power supply (hereinafter referred as VDD), each source terminal of the NMOS 12, 14 is connected to a low potential power supply (hereinafter referred as GND), and each drain terminal of the PMOS 11, 13 and the NMOS 12, 14 is connected to an output terminal N1 of the output buffer circuit 1. Also, the driving capability of the PMOS 13 is set to be larger than that of the PMOS 11, and the driving capability of the NMOS 14 is set to be larger than that of the NMOS 12. More particularly, for example, it is preferable that the PMOS 11, 13, are set to satisfy Wp1<Wp3 when the gate length is commonly Lp and the gate width is Wp1, Wp3, respectively, and similarly the NMOS 12, 14, are set to satisfy Wn2<Wn4 when the gate length is commonly Ln and the gate width is Wn2, Wn4, respectively.

Also, a gate of the PMOS 11 is connected to a node N4 which is a first driving output terminal of the first driving means 40, and a gate of the NMOS 12 is connected to a node N5 which is a second driving output terminal of the second driving means 50. Furthermore, a gate of the PMOS 13 is connected to the node N5 via the second switch circuit 70, and a gate of the NMOS 14 is connected to the node N4 via the first switch circuit 60. In the first and the second driving means 40, 50, a signal Sin from an internal circuit, which is to be outputted to the outside via the output buffer circuit 1 is inputted from an input terminal N2, and the conduction or non-conduction of the first and the second switch circuits 60, 70 is controlled by a control signal Scnt1 which is inputted from a first control input terminal N8.

Figure 5:
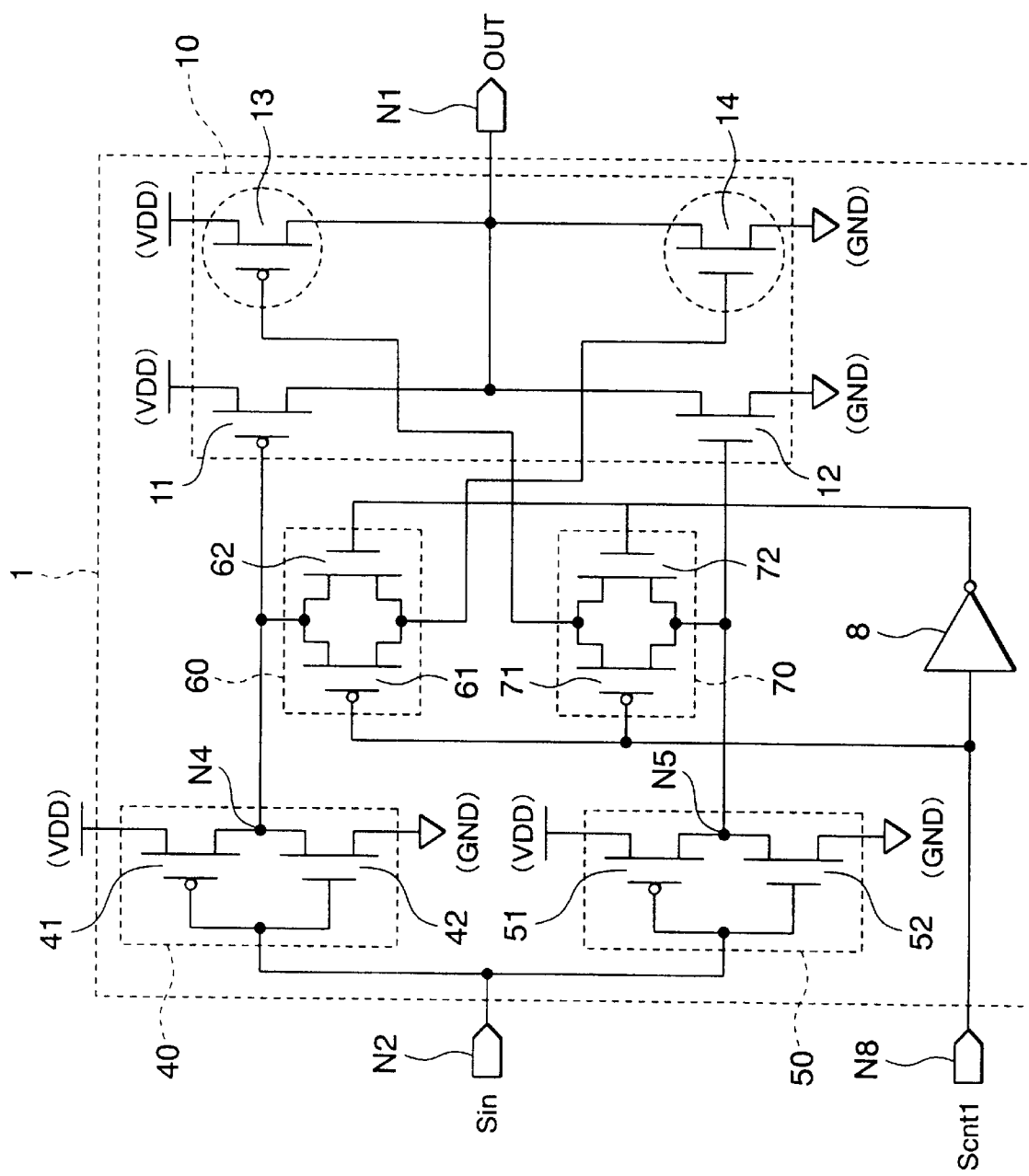
FIG. 5 is a circuit diagram showing the detailed structure of the output buffer circuit shown in FIG. 4.

FIG. 5 is a specific circuit diagram, in which the first and the second driving means 40, 50 in FIG. 4 are constituted by means of a transfer gate comprising a CMOS inverter, respectively, and the first and the second switch circuits 60, 70 are constituted by means of a transfer gate, respectively. As shown in FIG. 5, the first driving means 40 comprises an inverter constituted by serially connecting PMOS 41 of which a source terminal is connected to the VDD and NMOS 42 of which a source terminal is connected to the GND. The connection point where each drain terminal of the PMOS 41 and the NMOS 42 is serially connected is the node N4. Also, each gate of the PMOS 41 and the NMOS 42 is connected to the input terminal N2 of the output buffer circuit 1. Similarly, the second driving means 50 comprises an inverter constituted by serially connecting PMOS 51 of which a source terminal is connected to the VDD and NMOS 52 of which a source terminal is connected to the GND. The connection point where each drain terminal of the PMOS 51 and the NMOS 52 is serially connected is the node N5, and each gate of the PMOS 51 and the NMOS 52 is connected to the input terminal N2 of the output buffer circuit 1.

The first switch circuit 60 comprises a transfer gate connecting in parallel respective source-drain lines of PMOS 61 and NMOS 62 and having each gate as a control input terminal. One end of the parallel connected source-drain line is connected to the node N4 and the other end thereof is connected to a gate of the NMOS 14. Also, the second switch circuit 70 comprises a transfer gate connecting in parallel respective source-drain lines of PMOS 71 and NMOS 72 and having each gate as a control input terminal. One end of the parallel connected source-drain line is connected to the node N5 and the other end thereof is connected to a gate of the PMOS 13. Each gate of the PMOS 61, 71 is connected to a first control input terminal N8 of the output buffer circuit 1, and each gate of the NMOS 62, 72 is connected to an output terminal of an inverter 8, an input terminal of the inverter 8 being connected to the first control input terminal N8.

Next, the operation of the output buffer circuit 1 according to the first embodiment will be explained based on the circuit diagram of FIG. 5. When the signal Sin to be inputted to the input terminal N2 and the signal Scnt1 to be inputted to the first control input terminal N8 are at a high level (hereinafter referred to as "H") and at a low level hereinafter referred to as "L"), respectively, the states of the PMOS 41, the PMOS 51, the NMOS 12, and the NMOS 14 all become OFF, and the states of the NMOS 42, the NMOS 52, the PMOS 11, and the PMOS 13 all become ON, so that a signal OUT to be outputted from an output terminal N1 becomes "H".

Also, when the signal Sin to be inputted to the input terminal N2 and the signal Scnt1 to be inputted to the first control input terminal N8 are both in an "L" state the states of the PMOS 41, the PMOS 51, the NMOS 12, and the NMOS 14 all become ON and the states of NMOS 42, the NMOS 52, the PMOS 11, and the PMOS 13 all become OFF, so that the signal OUT to be outputted from the output terminal N1 becomes "L".

Figure 6:
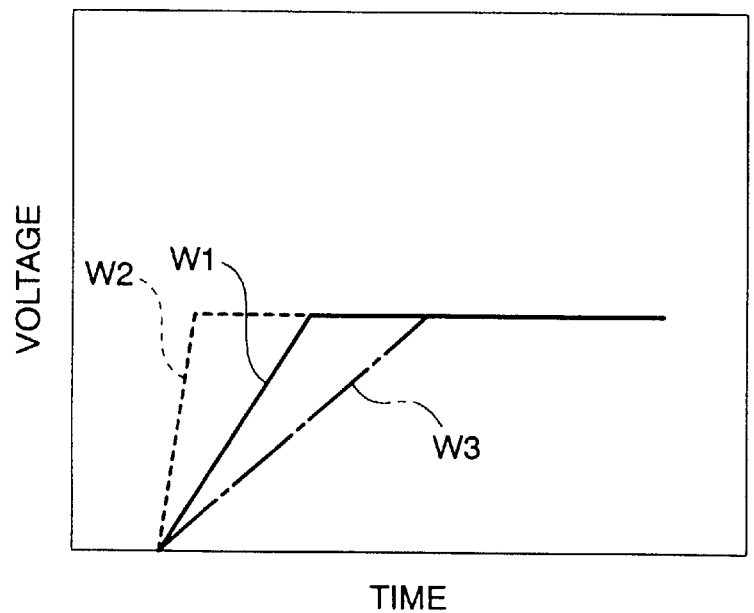
FIG. 6 is a schematic waveform diagram showing the change of output signal upon rising in the output buffer circuit shown in FIG. 5.

Next, the influence due to process fluctuations upon manufacturing a semiconductor device including the output buffer circuit 1 will be explained with reference to several examples. FIG. 6 is a schematic waveform diagram showing the change of an output signal upon rising in the output buffer circuit shown in FIG. 5.

First, an explanation will be given for the case of fluctuation as the ON resistance of the PMOS becomes small. When the signal Scnt1 to be inputted to the node N8 is L and the signal Sin to be inputted to the node N2 changes from L to H, the PMOS 41 constituting the first driving means 40 changes from ON to OFF. Also, since the switch circuits 60 and 70 are in ON states, the NMOS 14 changes from ON to OFF. Since the manufacturing process is progressing in the direction that the ON resistance of the PMOS becomes small, the ON resistance of the PMOS 41 becomes small so that the driving capability becomes large. Therefore, the rise of the output waveform of the first driving means 40 tends to be steep as a waveform W2 shown in FIG. 6. However, at this time, a resistance value of the PMOS 61 constituting the transfer gate also becomes small, so that the current tends to easily flow from the node N4 to the NMOS 14 having a large transistor size. In particular, the capacity of the NMOS 14 becomes large in appearance. Therefore, the load of the PMOS 41 increases practically and the current flowing through the source-drain line of the PMOS 41 increases, so that the rise of the output waveform of the first driving means 40 tends to be smooth as a waveform W3 shown in FIG. 6. Since they act to offset the variation from one another, the rise of the output waveform of the first driving means 40 becomes such a waveform W1 as shown in FIG. 6 so that the variation is reduced.

To the contrary, when the ON resistance of the PMOS became large, the ON resistance of the PMOS 41 constituting the first driving means 40 becomes large, so that the driving capability becomes small. Therefore, the rise of the output waveform of the first driving means 40 tends to be smooth as the waveform W3 shown in FIG. 6. However, at this time, a resistance value of the PMOS 61 constituting the transfer gate also becomes large, so that the current tends to hardly flow to the NMOS 14 having a large transistor size. In particular, the capacity of the NMOS 14 becomes small in appearance. Therefore, the load of the PMOS 41 decreases practically and the current flowing through the PMOS 41 decreases, so that the rise of the output waveform of the first driving means 40 tends to be steep as the waveform W2 shown in FIG. 6. Since they also act to offset the variation from one another, the rise of the output waveform of the first driving means 40 becomes such a waveform WI as shown in FIG. 6 so that the variation is reduced.

Also, when the ON resistance of the NMOS becomes small, the ON resistance of the NMOS 42 constituting the first driving means 40 becomes small, so that the driving capability becomes large. Therefore, the fall of the output waveform of the first driving means 40 tends to be steep. However, at this time, a resistance value of the NMOS 62 constituting the transfer gate also becomes small, so that the capacity of the PMOS 13 having a large transistor size becomes large in appearance. Therefore, the load of the NMOS 42 increases practically to offset the influence due to the increase of driving capability, so that variations in the fall of the output waveform of the first driving means 40 can be reduced.

To the contrary, when the ON resistance of the NMOS becomes large, the ON resistance of the NMOS 42 constituting the first driving means 40 becomes large, so that the driving capability becomes small. Therefore, the fall of the output waveform of the first driving means 40 tends to be smooth. However, at this time, a resistance value of the NMOS 62 constituting the transfer gate also becomes large, so that the capacity of the PMOS 13 having a large transistor size becomes small in appearance. Therefore, the load of the NMOS 42 decreases practically to offset the influence due to the decrease of driving capability, so that variations in the fall of the output waveform of the first driving means 40 can be reduced.

With respect to the second driving means 50, if the NMOS 41, the PMOS 42, the PMOS 61, the NMOS 62, the PMOS 13 and the NMOS 14 described in the operation of the first driving means 40 are replaced with the NMOS 51, the PMOS 52, the PMOS 71, the NMOS 72, the PMOS 13 and the NMOS 14, respectively, the operation thereof is similar to that of the first driving means 40, and therefore the detailed explanation thereof is omitted.

Also, because the states of the switch circuits 60 and 70 become OFF when the control signal Scnt1 is H, the states of the PMOS 13 and the NMOS 14 become OFF and variations of the output waveforms of the aforementioned first driving means 40 and second driving means 50 are not reduced. In particular, with respect to the output buffer circuit 1, the extent of variation in the output waveform can be controlled by changing the control signal Scnt1.

Also, in the output buffer circuit 1, the driving capability of the PMOS 13 is larger than that of the PMOS 11, and the driving capability of the NMOS 14 is larger than that of the NMOS 12. Thereby, in the output buffer circuit 1, it is possible to obtain the desired driving capability by the PMOS 13 and the NMOS 14 having large driving capacities, and at the same time, to ensure the slew rate of the waveform by the PMOS 11 and the NMOS 12 having small driving capacities.

Figure 7:
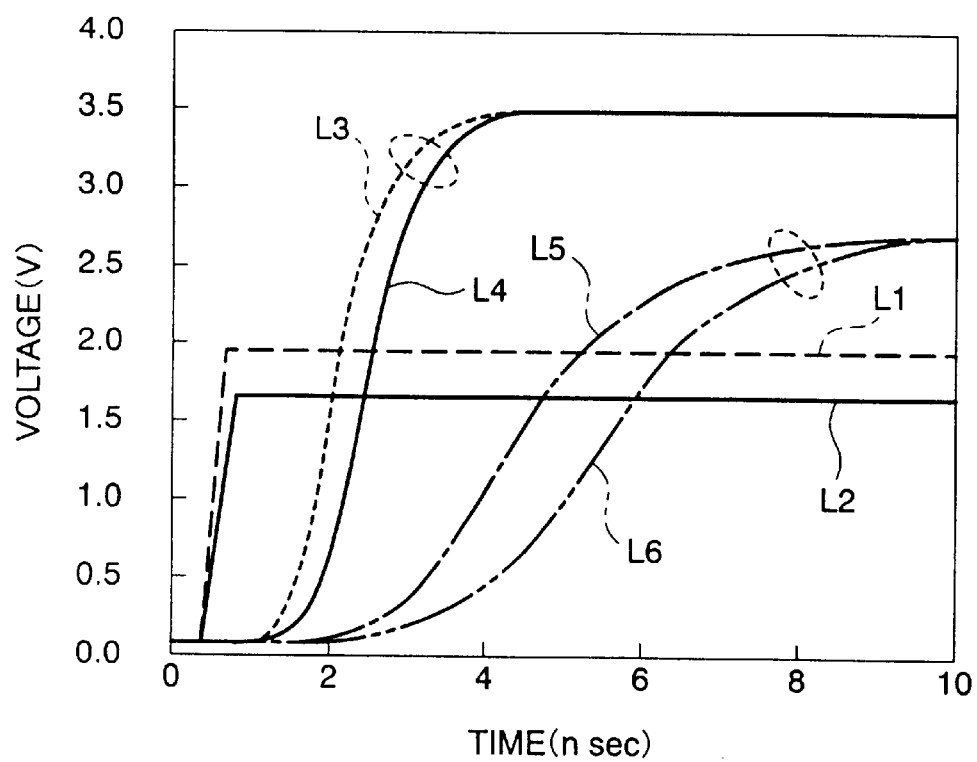
FIG. 7 shows a simulation result of the output buffer circuit shown in FIG. 5.
Figure 8:
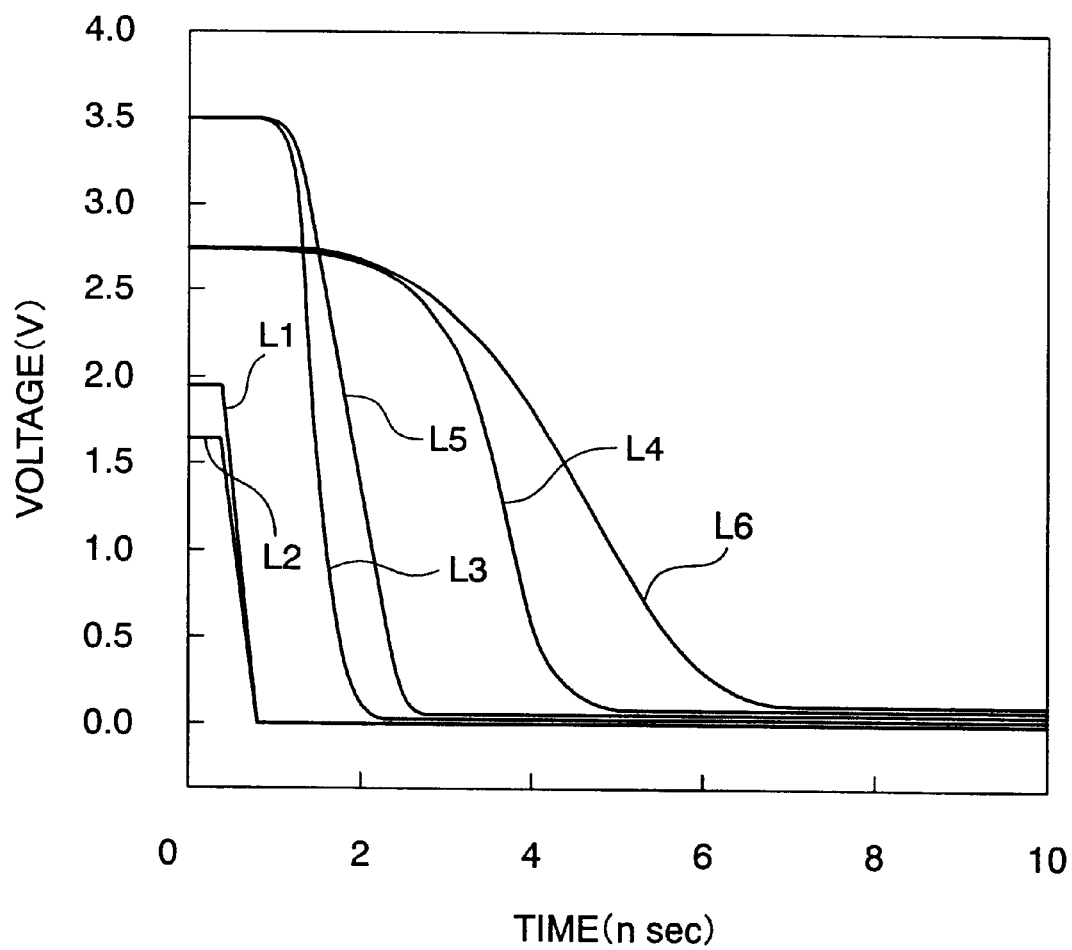
FIG. 8 shows a simulation result of the output buffer circuit shown in FIG. 5.

FIGS. 7 and 8 are waveform diagrams respectively showing the rise and fall portions resulting from the simulation in FIG. 5 on the maximum delay condition (SLOW condition), i.e., threshold value of the transistor being maximum (0.802V), ON current being minimuum (4.02 mA for 10 $\mu$m of the gate wedge) and source voltage being minimum (3.0V), operation temperature being maximum (125° C.), and the minimum delay condition (FAST condition), i.e., threshold value of the transistor being minimum (0.877V), ON current being maximum (6.17 mA for 10 $\mu$m of the gate wedge) and source voltage being maximum (3.6V), operation temperature being minimum (0° C.). Also, for comparison, the result from the simulation in the conventional circuit shown in FIG. 1 under the same conditions as the circuit of FIG. 5 is also represented. Lines L1 and L2 shown in FIGS. 7 and 8, represent waveforms of input signals in the output buffer circuit of the embodiments shown in FIG. 5 in the FAST condition and the SLOW condition, respectively. Lines L3 and L4 represent waveforms of output signals in the FAST condition and the SLOW condition, respectively, in the output buffer circuit of the embodiment shown in FIG. 5. Also, Lines L5 and L6 represent waveforms of output signals in the FAST condition and the SLOW condition, respectively, in the conventional output buffer circuit shown in FIG. 1.

Figure 9:
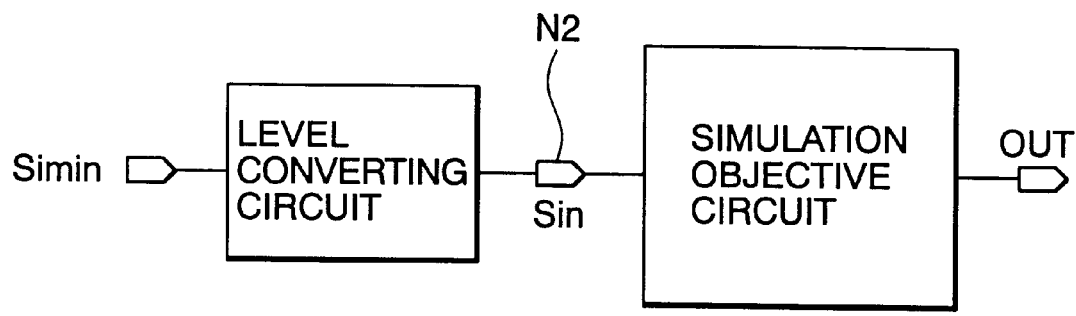
FIG. 9 is a block diagram showing a circuit for simulation.

Also, a simulation has been performed by inputting a signal to a simulation objective circuit (the circuit in FIG. 5, or the circuit in FIG. 1) via a level converting circuit as shown in FIG. 9, and at the same time, a reference element dimension is assumed, for example, that a channel length Lp of the PMOS is 0.36 $\mu$m and a channel length Ln of the NMOS is 0.52 $\mu$m, a channel width W of the PMOS 11 is 30 $\mu$m, a channel width W of the NMOS 14 is 200 $\mu$m, a channel width W of the PMOS 13 is 480 $\mu$m, a channel width W of the NMOS 12 is 40 $\mu$m, and the NMOS 62, 72 of the transfer gate have a channel length Ltn of 0.52 $\mu$m and a channel width W of 3 $\mu$m, respectively, and the PMOS 61, 71 thereof have a channel length Ltp of 0.36 $\mu$m and a channel width W of 3 $\mu$m, respectively.

Figure 1:
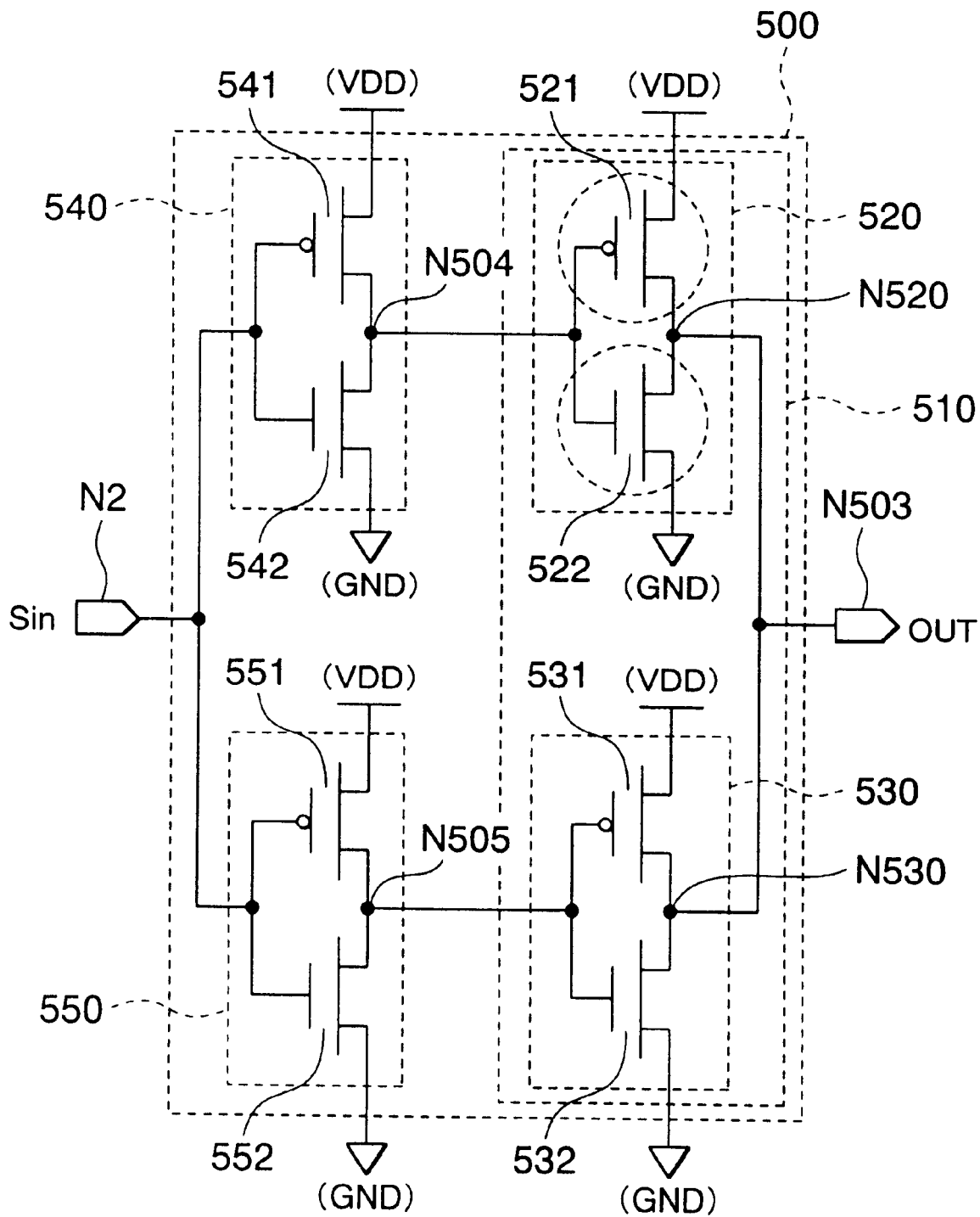
FIG. 1 is a circuit diagram showing an example of a conventional output buffer circuit.
Figure 2:
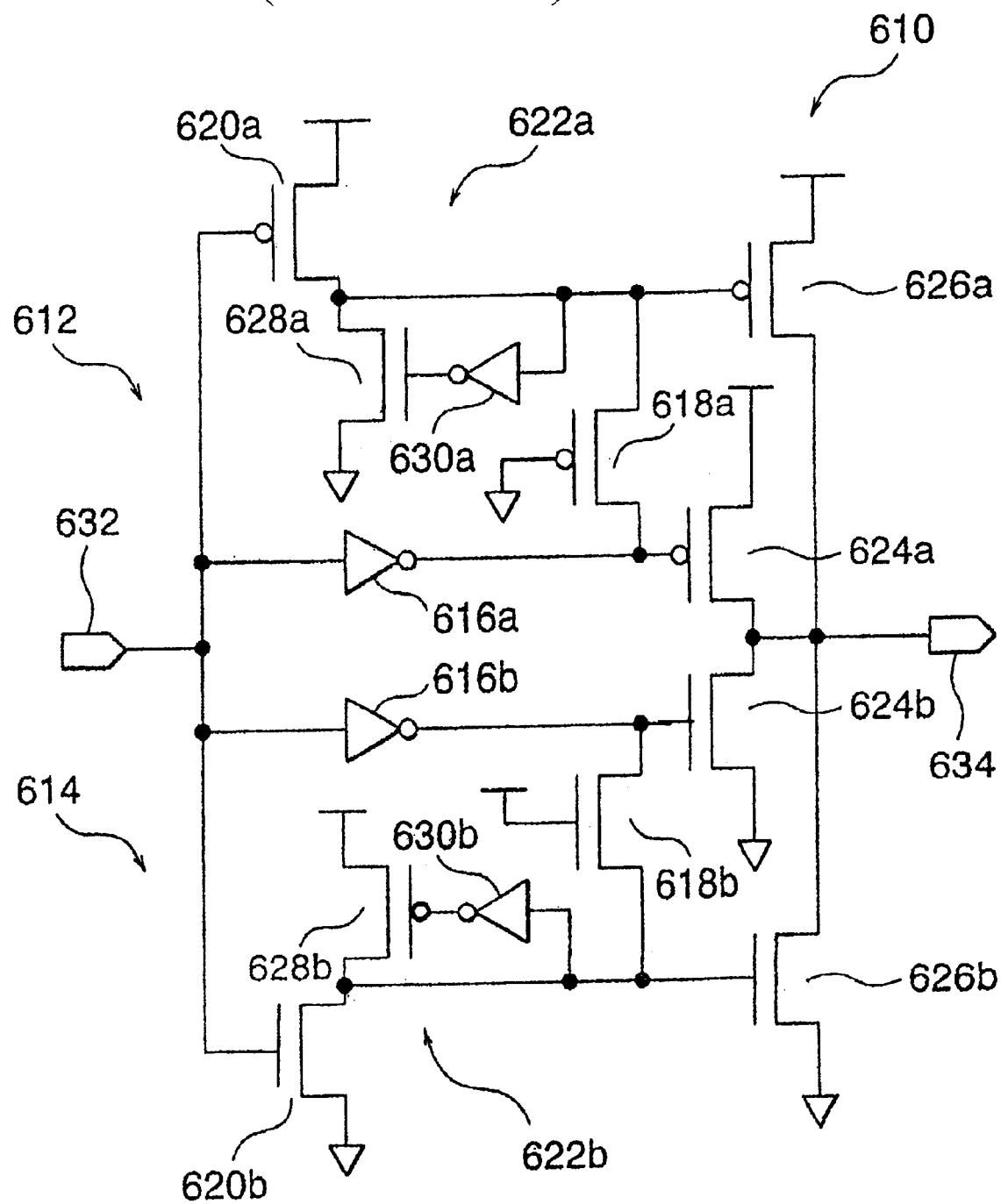
FIG. 2 is a circuit diagram showing an output buffer circuit disclosed in the Japanese Patent Publication Laid-Open No. Hei 11-191729.
Figure 3:
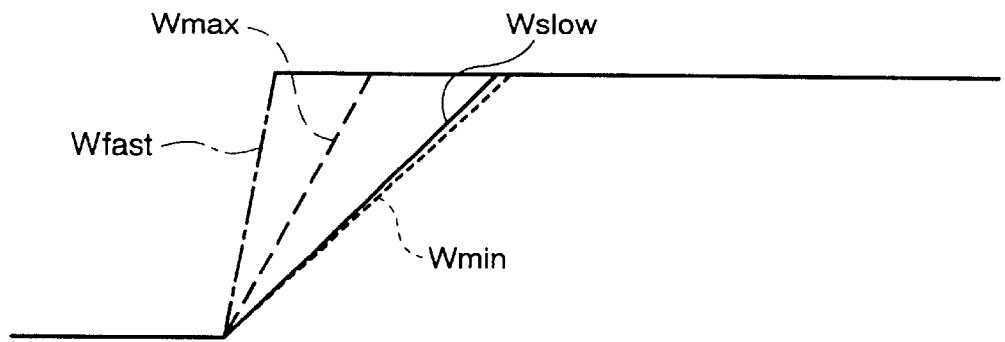
FIG. 3 is a schematic waveform diagram showing the change of output signal upon rising in the conventional output buffer circuit.

Also, Table 1 is a list of respective delay times (although including the delay time of the level converting circuit) and output rise times in the circuit of the embodiment of FIG. 5 and the conventional circuit of FIG. 1 obtained from the waveform diagram of FIG. 7. It is found that the variation in the circuit of FIG. 5 is suppressed more greatly than that in the circuit of FIG. 1 by comparing differences of respective delay times and output rise times between the SLOW condition and the FAST condition, i.e., maximum variation, in Table 1, FIGS. 7 and 8.

TABLE 1

| Condition | Circuit of the embodiment (FIG. 5) | | Conventional Circuit (FIG. 1) | |
|---|---|---|---|---|
| | Delay Time (nsec) | Rise Time (nsec) | Delay Time (nsec) | Rise Time (nsec) |
| SLOW | 3.520 | 1.618 | 4.544 | 1.933 |
| FAST | 1.363 | 0.505 | 1.768 | 0.583 |
| VARIATION | 2.157 | 1.113 | 2.776 | 1.350 |

Figure 10:
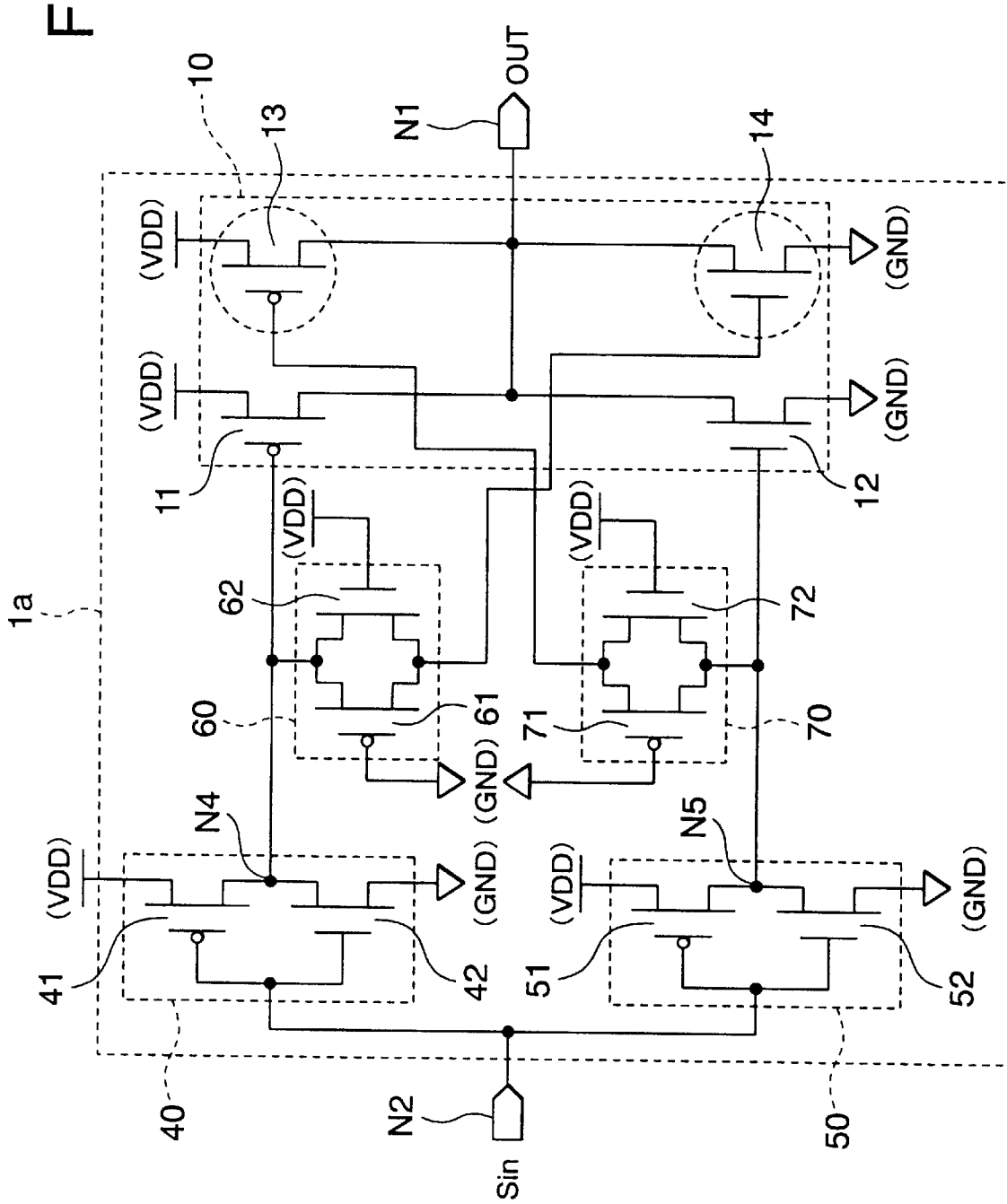
FIG. 10 is a circuit diagram showing an output buffer circuit according to a variation of the first embodiment of the present invention.

Next, a variation of the foregoing embodiment will be explained. FIG. 10 is a circuit diagram showing an output buffer circuit 1a according to the variation. In the aforementioned first embodiment, each gate of the PMOS 61, the NMOS 62 constituting the first switch circuit 60, the PMOS 71, and the NMOS 72 constituting the second switch circuit 70 is controlled by the control signal Scnt1 to be inputted from the first control input terminal N8. However, in the variation, as shown in FIG. 10, with respect to the output buffer circuit 1a, the gates of the PMOS 61, 71 may be connected to the GND potential and the gates of the NMOS 62, 72 may be connected to the VDD potential so as to be in an ordinarily conductive state. Thereby, the inverter 8 can be omitted, and at the same time, the switch circuits 60, 70 are always in ON states, so that variations of the waveforms of the aforementioned first driving means 40 and second driving means 50 are always reduced.

Figure 11:
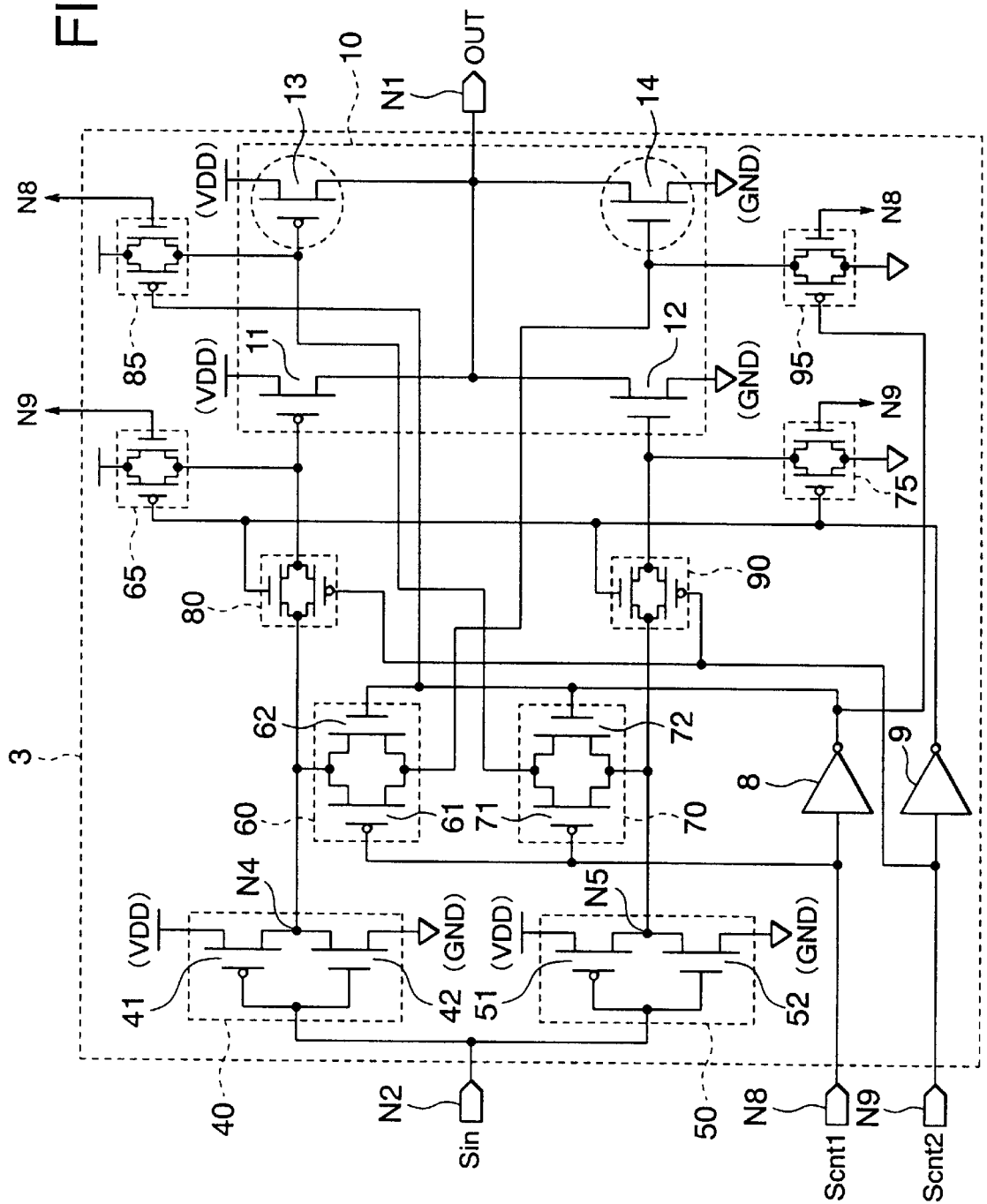
FIG. 11 is a circuit diagram showing an output buffer circuit according to a second embodiment of the present invention.

Next, a second embodiment of the present invention will be explained. FIG. 11 is a circuit diagram showing the structure of an output buffer circuit 3 of the second embodiment. The basic structure of the output buffer circuit 3 according to the second embodiment is almost same as that of the output buffer circuit 1 according to the first embodiment, and same parts as that of FIG. 5 are designated with same reference numerals and description thereof will be omitted. The difference in the output buffer circuit 3 according to the second embodiment from the output buffer circuit 1 is that the node N4 and the gate of the PMOS 11 are connected via a third switch circuit 80 inserted into the gate side of the PMOS 11 rather than the connection point between the node N4 and the first switch circuit 60, and the node N5 and the gate of the NMOS 12 are connected via a fourth switch circuit 90 inserted into the gate side of the NMOS 12 rather than the connection point between the node N5 and the second switch circuit 70, so that conduction and non-conduction of the third and the fourth switch circuits 80, 90 are controlled by a second control signal Scnt2 to be inputted from a second control input terminal N9, and at the same time, each gate of the PMOS 11, 13 and the VDD are connected via a fifth and a seventh switch circuit 65, 85, respectively, and each gate of the NMOS 12, 14 and the GND are connected via a sixth and an eighth switch circuit 75, 95, respectively, so that conduction and non-conduction of the fifth and the sixth switch circuits 65, 75 are controlled by the second control signal Scnt2 and conduction and non-conduction of the seventh and the eighth switch circuits 85, 95 are controlled by the control signal Scnt1. Also, the fifth and the sixth switch circuits 65, 75 are connected to act conversely to the third and the fourth switch circuits 80, 90, and the seventh and the eighth switch circuits 85, 95 are connected to act conversely to the first and the second switch circuits 60, 70. In particular, the seventh and the eighth switch circuits 85, 95 are controlled to be in a non-conductive state when the first and the second switch circuits 60, 70 are in a conductive state, and in a conductive state when the first and the second switch circuits 60, 70 are in a non-conductive state. Also, the fifth and the sixth switch circuits 65, 75 are controlled to be in a non-conductive state when the third and the fourth switch circuits 80, 90 are in a conductive state, and in a conductive state when the third and the fourth switch circuits 80, 90 are in a non-conductive state. Also, the third to the eighth switch circuits 80, 90, 65, 75, 85, 95 are easily constructed by means of the transfer gate as shown in FIG. 11.

The output buffer circuit 3 of the second embodiment is the same as that of the first embodiment in that the influence of fluctuations in the manufacturing process on characteristics of the output signal (rise time, fall time, delay time, etc.) can be suppressed, and additionally, the driving capability of the output buffer circuit 3 can be switched by combining the control signal Scnt1 and the second control signal Scnt2. Specifically, when the control signal Scnt1 and the second control signal Scnt2 are at a low level, respectively, both the PMOS 11 and the NMOS 14 are connected to the first driving circuit 40, and both the PMOS 13 and the NMOS 12 are connected to the second driving circuit 50. Also, when the control signal Scnt1 is at a high level and the second control signal Scnt2 is at a low level, only the PMOS 11 is connected to the first driving circuit 40, and only the NMOS 12 is connected to the second driving circuit 50. Furthermore, when the control signal Scnt1 is at a low level and the second control signal Scnt2 is at a high level, only the NMOS 14 is connected to the first driving circuit 40, and only the PMOS 13 is connected to the second driving circuit 50. Thereby, it is possible to make the driving capability of the output buffer circuit 3 correspond to the driving capability of the respective transistors or their sum. As a result, the driving capability of the output buffer circuit 3 can optionally be adjusted.

Figure 12:
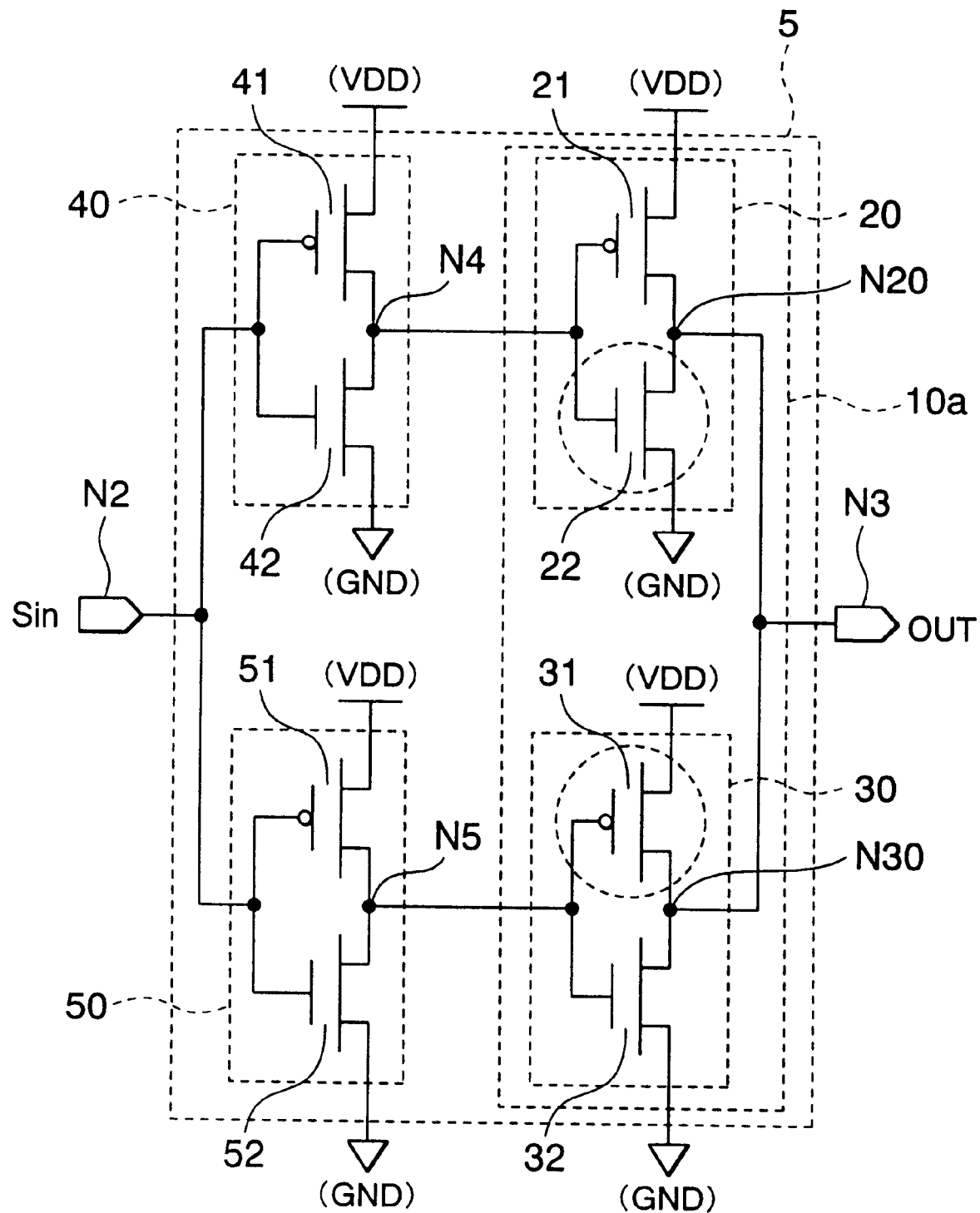
FIG. 12 is a circuit diagram showing an output buffer circuit according to a third embodiment of the present invention.

Next, a third embodiment of the present invention will be explained. FIG. 12 is a circuit diagram showing the structure of the third embodiment of the present invention. As shown in FIG. 12, an output buffer circuit 5 of the third embodiment comprises an output transistor section 10a, and the first and the second driving means 40, 50. The output transistor section 10a comprises PMOS 21, 31 which are a first and a second transistor of the first conductive type, and NMOS 22, 32 which are a first and a second transistor of the second conductive type. Each source terminal of the PMOS 21, 31 is connected to the VDD, each source terminal of the NMOS 22, 32 is connected to the GND, and the drain terminals of each of the PMOS 21, 31 and the NMOS 22, 32 are all connected to an output terminal N3 of the output buffer circuit 5. Also, the driving capability of the PMOS 31 is set to be larger than that of the PMOS 21, and the driving capability of the NMOS 22 is set to be larger than that of the NMOS 32. Specifically, a channel width of the PMOS 21 is set to be narrower than that of the PMOS 31, and a channel width of the NMOS 22 is set to be wider than that of the NMOS 32. Also, an inverter 20 comprises the PMOS 21 and the NMOS 22, an inverter 30 comprises the PMOS 31 and the NMOS 32, an input terminal of the inverter 20 is connected to the node N4, and an input terminal of the inverter 30 is connected to the node N5.

Accordingly, for example, when the output signal of the output buffer circuit 5 is rising from a low level to a high level, the PMOS 21 of the inverter 20 which is driven by the first driving means 40 initiates ON operation more quickly than the PMOS 31 of the inverter 30 which is driven by the second driving means 50. However, the NMOS 22 of the inverter 20 has a wide channel width so that time for transitioning into an OFF state is taken into account; thereby it is possible to relieve the steep level change due to the PMOS 21 and to obtain the smooth level change. At this time, since the channel width of the PMOS 31 and the NMOS 32 constituting the inverter 30 connected to the output terminal N3 has a size inversely proportional to the channel width of the PMOS 21 and the NMOS 22 constituting the inverter 20, the switching point is rapid and the desired driving capability can be realized.

The slew rate of the output buffer circuit 5 includes an effect due to ON-ON states of the output stage, and when a current passes through the inverter 30 in the ON-ON state, the output of the node N30 is blunted. Therefore, it is not necessary to considerably blunt the output of the first and the second driving means 40, 50, and thereby the variation in characteristics of the first and the second driving means 40, 50 due to the fluctuation of the manufacturing process can be suppressed, so as to be small.

Although the technical spirit of the present invention has been disclosed with reference to the appended drawings and the preferred embodiments of the present invention corresponding to the drawings have been described, descriptions in the present specification are only for illustrative purposes, and not for limiting the present invention.

Also, those who are skilled in the art will appreciate that various modifications, additions and substitutions are possible without departing from the scope and spirit of the present invention. Therefore, it should be understood that the present invention is limited only to the accompanying claims and the equivalents thereof, and includes the aforementioned modifications, additions and substitutions.

What is claimed is:

1. An output buffer circuit comprising:
   an output transistor section, said output transistor section comprising:
   an output terminal;
   a first transistor of a first conductive type of which one end of the source-drain line is connected to a high potential power supply and the other end thereof is connected to said output terminal;
   a second transistor of the first conductive type having a larger driving capability than that of said first transistor of the first conductive type and of which one end of the source-drain line is connected to the high potential power supply and the other end thereof is connected to said output terminal;
   a first transistor of a second conductive type of which one end of the source-drain line is connected to a low potential power supply and the other end thereof is connected to said output terminal;
   a second transistor of the second conductive type having a larger driving capability than that of said first transistor of the second conductive type and of which one end of the source-drain line is connected to a low potential power supply and the other end thereof is connected to said output terminal;
   a first logic gate including a first input terminal to which an input signal is inputted and a first driving output terminal to be connected to a gate of said first transistor of the first conductive type;
   a second logic gate including a second input terminal to which said input signal is inputted and a second driving output terminal to be connected to a gate of said first transistor of the second conductive type;
   a first switch circuit connected between the gate of said second transistor of the first conductive type and said second driving output terminal and including a first transfer gate so that conduction thereof is controlled by a control signal; and
   a second switch circuit connected between the gate of said second transistor of the second conductive type and said first driving output terminal and including a second transfer gate so that conduction thereof is controlled by a control signal.

2. The output buffer circuit according to claim 1, wherein conduction of said first and said second switch circuits are controlled synchronously by same control signal.

3. The output buffer circuit according to claim 1, further comprising:
   a third switch circuit for applying a first voltage to the gate of said first transistor of the first conductive type to control the conduction of the source-drain line of said first transistor of the first conductive type;
   a fourth switch circuit for applying the first voltage to the gate of said second transistor of the first conductive type to control the conduction of the source-drain line of said second transistor of the first conductive type;
   a fifth switch circuit for applying a second voltage to the gate of said first transistor of the second conductive type to control the conduction of the source-drain line of said first transistor of the second conductive type; and
   a sixth switch circuit for applying the second voltage to the gate of said second transistor of the second conductive type to control the conduction of the source-drain line of said second transistor of the second conductive type.

4. The output buffer circuit according to claim 1, wherein said first and said second transistors of the first conductive type are P channel type MOS transistors, and said first and second transistors of the second conductive type are N channel type MOS transistors.

5. The output buffer circuit according to claim 1, wherein the gate of said second transistor of the first conductive type has a width larger than that of the gate of said first transistor of the first conductive type, and the gate of said second transistor of the second conductive type has a width larger than that of the gate of said first transistor of the second conductive type.

6. An output buffer circuit comprising:
   an output transistor section, said output transistor section comprising:
   an output terminal;
   a first transistor of a first conductive type of which one end of the source-drain line is connected to a high potential power supply and the other end thereof is connected to said output terminal;
   a second transistor of the first conductive type having a larger driving capability than that of said first transistor of the first conductive type and of which one end of the source-drain line is connected to the high potential power supply and the other end thereof is connected to said output terminal;
   a first transistor of a second conductive type of which one end of the source-drain line is connected to a low potential power supply and the other end thereof is connected to said output terminal;
   a second transistor of the second conductive type having a larger driving capability than that of said first transistor of the second conductive type and of which one end of the source-drain line is connected to the low potential power supply and the other end thereof is connected to said output terminal;
   a first logic gate including a first input terminal to which an input signal is inputted and a first driving output terminal to be connected to a gate of said first transistor of the first conductive type and a gate of said second transistor of the second conductive type;
   a second logic gate including a second input terminal to which said input signal is inputted and a second driving output terminal to be connected to a gate of said second transistor of the first conductive type and a gate of said first transistor of the second conductive type;
   a first switch circuit connected between the gate of said second transistor of the first conductive type and said second driving output terminal; and
   a second switch circuit connected between the gate of said second transistor of the second conductive type and said first driving output terminal;
   wherein said first and second switch circuits each comprise a first transistor of a first conductive type and a second transistor of a second conductive type, wherein the gates of the switch circuit transistors of the first type are connected to a high potential power supply, and the gates of the switch circuit transistors of the second type are connected to a low potential power supply; and wherein none of the gates of the switch circuit transistors is controlled by a control signal.

* * * * *